United States Patent [19]
Gillette

[11] Patent Number: 5,952,821
[45] Date of Patent: Sep. 14, 1999

[54] LOAD CIRCUIT FOR INTEGRATED CIRCUIT TESTER

[75] Inventor: Garry Gillette, San Jose, Calif.

[73] Assignee: Credence Systems Corporation, Fremont, Calif.

[21] Appl. No.: 08/924,035

[22] Filed: Aug. 29, 1997

[51] Int. Cl.$^6$ .................................................. G01R 19/00
[52] U.S. Cl. ...................................................... 324/158.1
[58] Field of Search ............................... 324/73.1, 158.1, 324/765, 763; 438/14, 17; 257/40, 48; 307/115, 80; 714/25, 733, 734, 724

[56] References Cited

U.S. PATENT DOCUMENTS

| | | | |
|---|---|---|---|
| 3,849,726 | 11/1974 | Justice | 324/73.1 |
| 4,712,058 | 12/1987 | Branson et al. | 324/763 |
| 4,720,671 | 1/1988 | Tada et al. | 324/765 |
| 5,276,355 | 1/1994 | Nagata | 307/115 |

*Primary Examiner*—Vinh P. Nguyen
*Attorney, Agent, or Firm*—Smith-Hill and Bedell

[57] ABSTRACT

A load circuit for an integrated circuit tester provides an adjustable load at a terminal of an integrated circuit device under test (DUT) when the DUT is generating an output signal at the terminal. The load circuit includes positive and negative current sources for producing positive and negative currents of magnitudes that are non-linear functions input reference voltages. A diode quad connects the negative current source to the DUT terminal when the DUT output signal is below an input threshold voltage and connects the positive current source to the DUT terminal when the DUT output signal is above the threshold voltage. The current sources provide a non-linear, exponential, transfer function between input reference voltage and output current magnitude so that the current sources provide a relatively wide output current range in response to a relatively narrow input reference voltage range.

16 Claims, 3 Drawing Sheets

LOAD CIRCUIT FOR INTEGRATED CIRCUIT TESTER

BACKGROUND OF THE INVENTION

1. Field of the Invention

The present invention relates in general to integrated circuit (IC) testers and in particular to a load circuit for providing an adjustable load current at a terminal of an IC device under test.

2. Description of Related Art

A typical IC tester includes a set of pin electronics circuits, one for each pin or terminal of an IC device under test (DUT). Each pin electronics circuit is capable of either transmitting a test signal to a DUT terminal or sampling an IC output signal produced at the DUT terminal to determine its logic state. Normally, when sampling a DUT output signal, the pin electronics circuit must provide, with reasonably high accuracy, a specified load current into or out of the IC terminal depending on whether the IC output signal is at a specified low or high logic level.

FIG. 1 illustrates a typical prior art load circuit 10 for providing adjustable high and low logic level load currents $I_{OH}$ and $I_{OL}$ at a DUT terminal 12. A unity gain operational amplifier 13 receives an input reference threshold voltage $V_{th}$ and supplies it to a bridge-connected switching diode quad 14 also coupled to DUT terminal 12. An adjustable current source 16 controlled by an input reference voltage $V_L$ supplies a current $I_{OL}$ into diode quad 14. Another adjustable current source 18 controlled by input voltage $V_H$ draws a current $I_{OH}$ from diode quad 14. When the DUT output signal at terminal 12 falls to a low logic level sufficiently below the threshold voltage $V_{TH}$, diode quad 14 connects current source 16 to DUT terminal 12 instead of to amplifier 13 so that DUT terminal 12 receives the specified low logic level load current $I_{OL}$. Conversely, when the DUT output signal at terminal 12 rises to a high logic level sufficiently above threshold voltage $V_{TH}$, diode quad 14 connects current source 18 to DUT terminal 12 instead of to amplifier 13 so that the specified high logic level load current $I_{OH}$ is drawn from DUT terminal 12.

FIG. 2 illustrates a typical prior art current source 18 as has been used in load circuit 10 of FIG. 1. Current source 18 includes an operational amplifier 22 receiving the input control voltage $V_H$ and driving the base of a transistor 24. The emitter of transistor 24 drives the base of another transistor 26 having an emitter coupled to $V_H$ (common) through a switched resistor network 28 and to an inverting input of operational amplifier 22. The collectors of transistors 24 and 26 are interconnected and draw the output current $I_{OH}$. Operational amplifier 22 supplies sufficient voltage to the base of transistor 24 so that the voltage $V'_H$ appearing across resistor network 28 is held substantially equal to $V_H$. Thus the current through resistor network 28 is substantially equal to $V_H/R_T$ where $R_T$ is the resistance on resistor network 28. Since the current into the base of transistor 24 is very small, the current source 18 output current $I_{OH}$ drawn by the collectors of transistors 24 and 26 is also substantially equal to $V_H/R_T$. The resistance of resistor network 28 is selected by input signal RANGE controlling the network switches. Current source 16 of FIG. 1 is analogous to circuit 18 but is constructed using PNP transistors instead of NPN transistors so that is supplies a positive current output.

The input control voltage $V_H$ is typically generated by a digital-to-analog (A/D) converter (not shown) which normally can vary the control voltage $V_H$ over only a relatively limited range, for example from 0 to +3V with a resolution of 3V/256 for an 8-bit A/D converter. Specified DUT load currents produced in response to that control-voltage can vary over a wide range, for example from +/−0.1 microamp to +/−100 milliamps. Since the transfer function of current source 18 relating output current $I_{OH}$ to input voltage $V_H$ is linear, we could obtain a wide output current range by using single small resistor at the emitter of transistor 26. However since the resolution with which the output current can be adjusted would be 100 milliamps/256 (about 400 microamps), then at the lower end of its range, the resolution with which the output load current could be adjusted would be unacceptably poor. By using the switched resistor network 28, rather than a single resistor, at the emitter of transistor 26, current source 18 provides several output current ranges, each having an acceptable resolution.

The adjustable current source 18 of FIG. 2 has a drawback in that resistor network 28 requires the use of discrete components (resistors and relay or FET switches) which cannot be included in an integrated circuit implementing the rest of current source 18. Since an integrated circuit tester requires a large number of load circuits, the many discrete component resistor networks needed add substantial cost and size to an IC tester. What is needed is programmable load circuit that can be implemented on a single integrated circuit without need of external discrete components and which can provide a wide range of output load currents with adequate resolution in response to a relatively narrow input control voltage range.

SUMMARY OF THE INVENTION

A load circuit for an integrated circuit tester provides an adjustable load current to a terminal of an integrated circuit device under test (DUT) when the DUT is generating an output signal at the terminal. The load circuit includes current sources for producing positive and negative currents of magnitudes controlled by input reference voltages. A diode quad connects the negative current source to the DUT terminal when the DUT output signal is below an input threshold voltage and connects the positive current source to the DUT terminal when the DUT output signal is above the threshold voltage. In accordance with the invention, each current source provides a non-linear, exponential transfer function between its input reference voltage and its output current so that the current source provides a relatively wide output current range in response to a relatively narrow input reference voltage range.

Having exponential transfer functions, the current sources do not require range switched load resistors to provide a wide dynamic output current range and can therefore be fully implemented by integrated circuits. Also, with an exponential transfer function, the resolution with which the output current can be adjusted is a substantially fixed percentage of the target output current rather than a fixed percentage of its maximum output current. Thus the resolution with which output current can be adjusted remains appropriate to the target output current level throughout its full range.

It is accordingly an object of the invention to provide a load circuit for an integrated circuit tester for providing an accurately adjustable load current at a terminal of an integrated circuit device under test (DUT) when the DUT is generating an output signal at the terminal.

It is another an object of the invention to provide a load circuit which can be implemented in integrated circuit form without range switched load resistors.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

DESCRIPTION OF THE PREFERRED EMBODIMENT(S)

Figure 1:
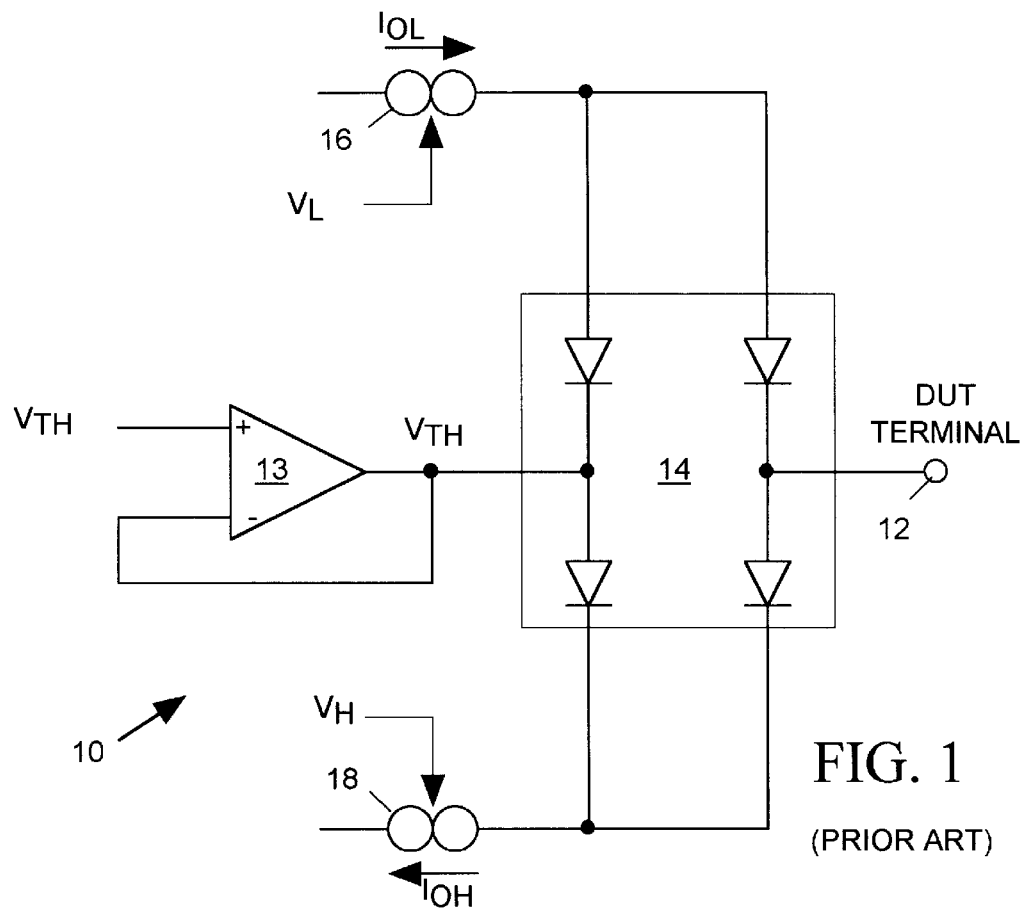
FIG. 1 is a block and schematic diagram of a typical prior art load circuit for an integrated circuit tester.
Figure 2:
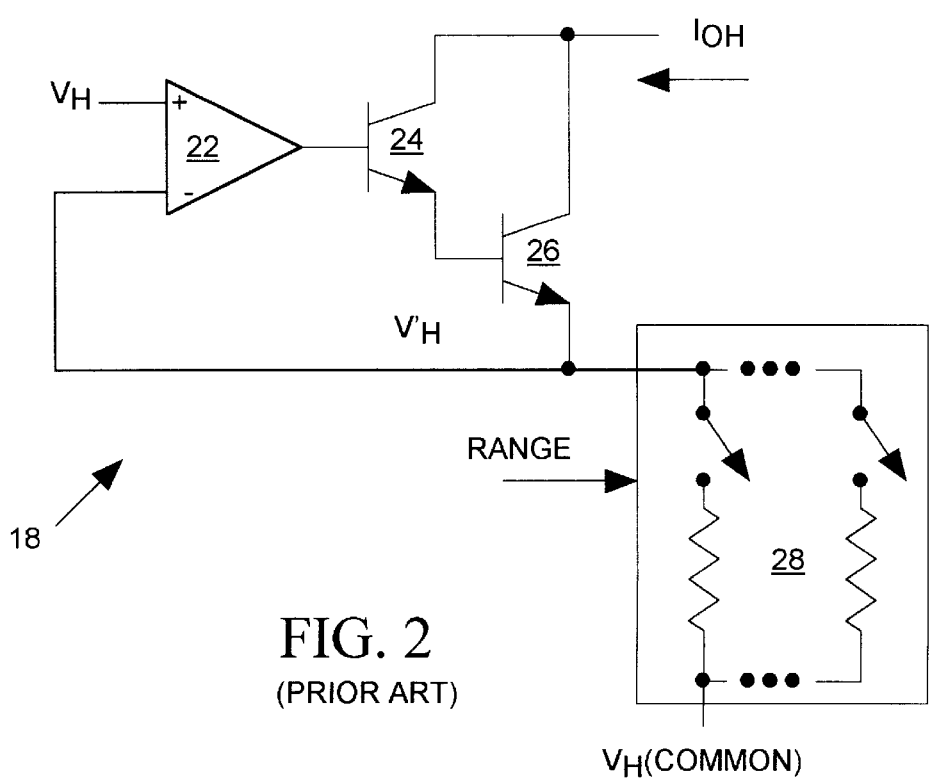
FIG. 2 is a block and schematic diagram illustrating a prior art current source for the circuit tester of FIG. 1 in more detail.
Figure 3:
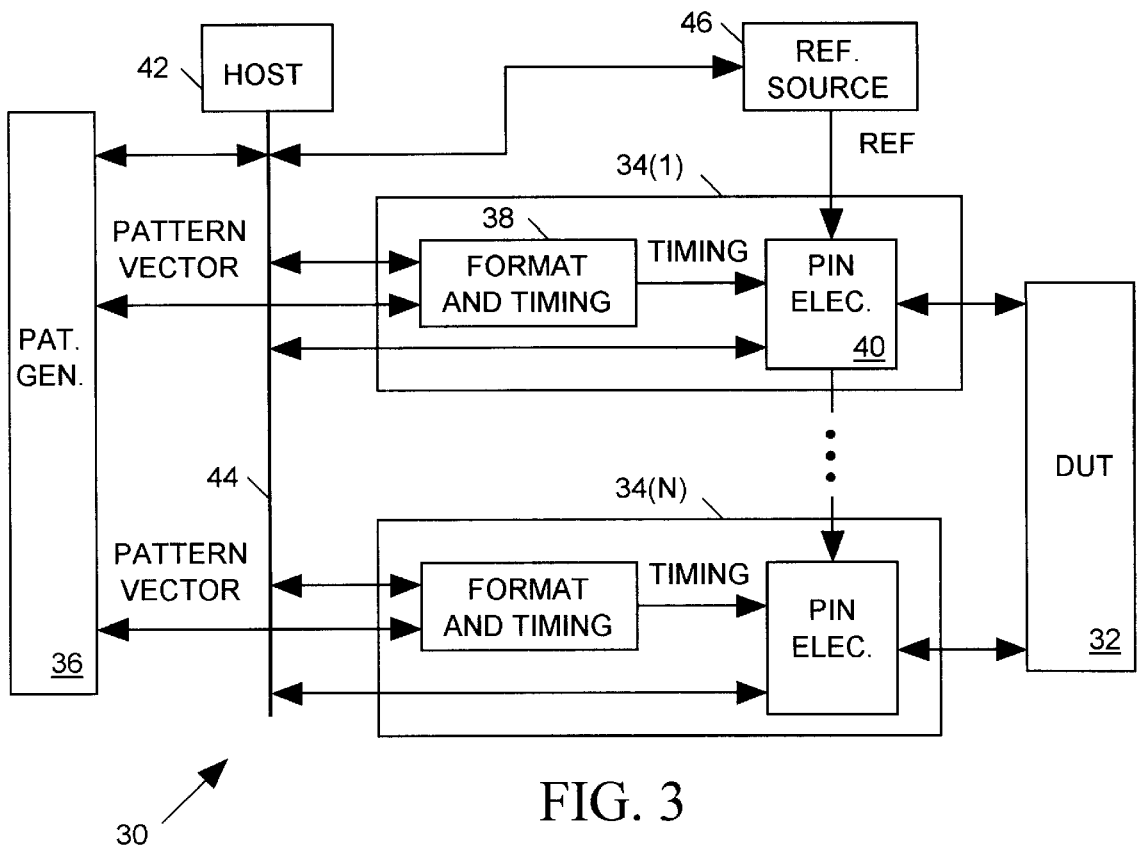
FIG. 3 is a block diagram of an integrated circuit tester in accordance with the present invention.

FIG. 3 illustrates an integrated circuit tester 30 for carrying out a test on an integrated circuit device under test (DUT) 32. Tester 30 includes a set of N tester channels 34(1)–34(N), one connected to each terminal or pin of DUT 32. A test is organized into successive test cycles, and at the beginning of each test cycle a pattern generator 36 supplies input control data (PATTERN VECTOR) to a format and timing circuit 38 within each channel. The PATTERN VECTOR references one or more test activities that a pin electronics circuit 40 is to carry out at the DUT terminal during the test cycle. In response to the PATTERN VECTOR the format and timing circuit 36 supplies a set of control signals (TIMING) a corresponding pin electronics circuit 40. Each TIMING signal controls a separate test activity, with TIMING signal edges indicating when the activity should be carried out. For example some TIMING signals indicate when pin electronics circuit 40 should drive an output DUT test signal to a high or low logic level and when the test signal should be tristated. Other TIMING signals indicate when the pin electronics circuit 40 should sample a DUT output signal.

Before the test begins, a host computer 42 supplies programming data to pattern generator 36 via a conventional computer bus 44, the programming data defining the output data pattern that it is to produce. Host computer 42 also supplies programming data to the format and timing circuit within each channel 34(1)–34(N) for controlling how the format and timing circuit 38 responds to each PATTERN VECTOR data value. As explained in more detail below, a reference voltage source 46, also programmed by host computer 42, supplies the pin electronics circuits 40 with various reference voltages (REF) for controlling aspects of their test activities. After the test is complete, the host computer 42 obtains test result data from pin electronics circuits 40 via bus 44.

Figure 4:
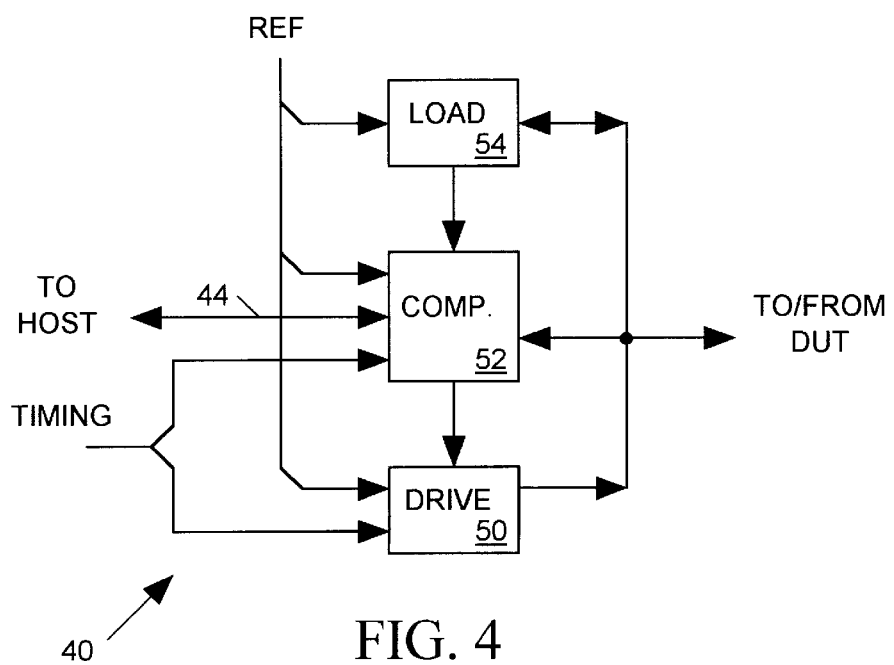
FIG. 4 is a block diagram illustrating a pin electronics circuit of the integrated circuit tester of FIG. 3 in more detail.

FIG. 4 illustrates a typical pin electronics circuit 40 of FIG. 3 in more detailed block diagram form. Pin electronics circuit 40 includes a drive circuit 50 for supplying a test signal to a terminal of DUT 32 of FIG. 3 and a compare circuit 52 for sampling the DUT output signal produced at that terminal and comparing it to reference levels to determine its logic state. The drive and compare circuits 50, 52 receive separate input reference voltages REF from reference source 46 of FIG. 3 for establishing various operating parameters such as for example, the high and low test signal logic levels. After the test, host computer 42 of FIG. 3 uses computer bus 44 to obtain test results stored in compare circuit 52. Drive and compare circuits 50 and 52 are well known to those skilled in the art and are not further detailed herein.

Pin electronics circuit 40 also includes a load circuit 54, in accordance with the invention, for providing an adjustable load current into or out of the DUT terminal when DUT 32 is generating an output signal at the terminal. As described in detail below, reference source 46 of FIG. 3 supplies load circuit 54 with reference voltages (REF) for controlling the magnitude of the load currents and for indicating a threshold level between high and low logic level at the DUT terminal.

Figure 5:
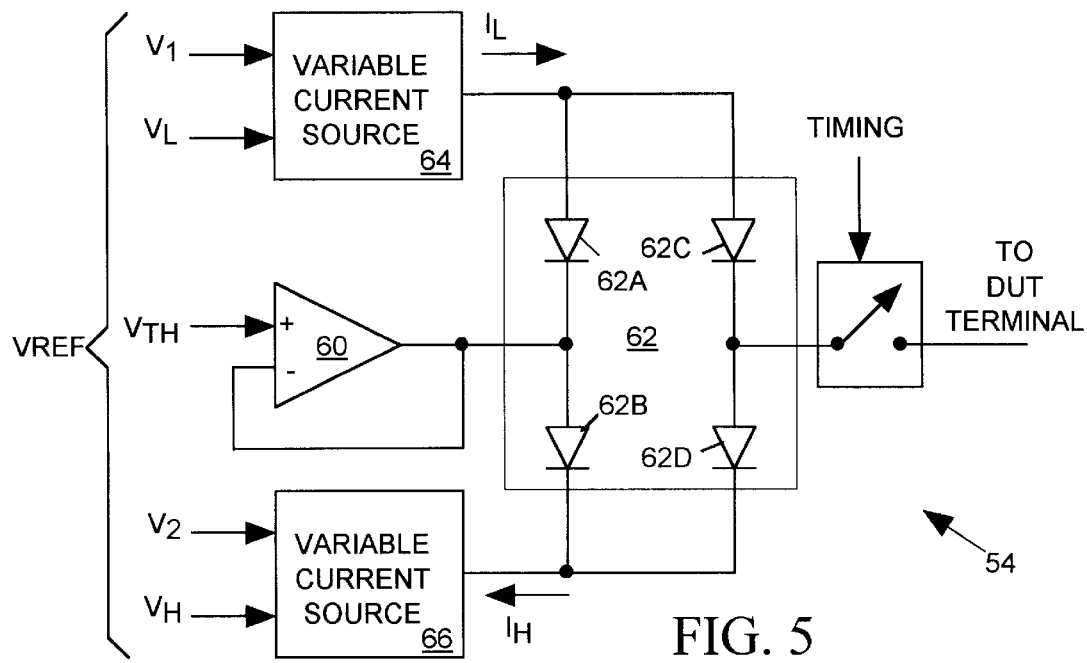
FIG. 5 is a block and schematic diagram illustrating the load circuit of the pin electronics circuit of FIG. 4 in more detail.

FIG. 5 illustrates load circuit 54 of FIG. 4 in more detailed block and schematic diagram form. Load circuit 54 includes an operational amplifier 60 receiving the input threshold voltage $V_{TH}$ and supplying it to a diode quad 62 formed by diodes 62A–62D. A variable ("first") current source 64 controlled by input reference voltages $V_L$ and $V_1$ supplies a constant positive current $I_L$ while another variable ("second") current source 66 controlled by input reference voltages $V_H$ and $V_2$ sinks a constant negative current $I_H$. When the signal at the DUT output terminal falls to a low logic level sufficiently below the threshold voltage $V_{TH}$, diodes 62C and 62B are forward biased and diodes 62A and 62D are reverse biased. Source 64 supplies its output current $I_L$ through diode 62C to the DUT terminal and while current source 66 draws its current $I_H$ from amplifier 60 via diode 62B. Conversely, when the signal at the DUT terminal rises to a high logic level sufficiently above threshold voltage $V_{TH}$, diodes 62A and 62D are forward biased and diodes 62B and 62C are reverse biased. Source 64 then supplies its output current $I_L$ through diode 62A to amplifier 60 while current source 66 draws its output current $I_H$ through diode 62D from the DUT terminal. When the DUT terminal voltage is not sufficiently higher or lower than the threshold voltage $V_{TH}$ diodes 62A and 62B are forward biased and diodes 62C and 62D are both reverse biased. Thus neither load current $I_H$ or $I_L$ is supplied to the DUT terminal.

Figure 6:
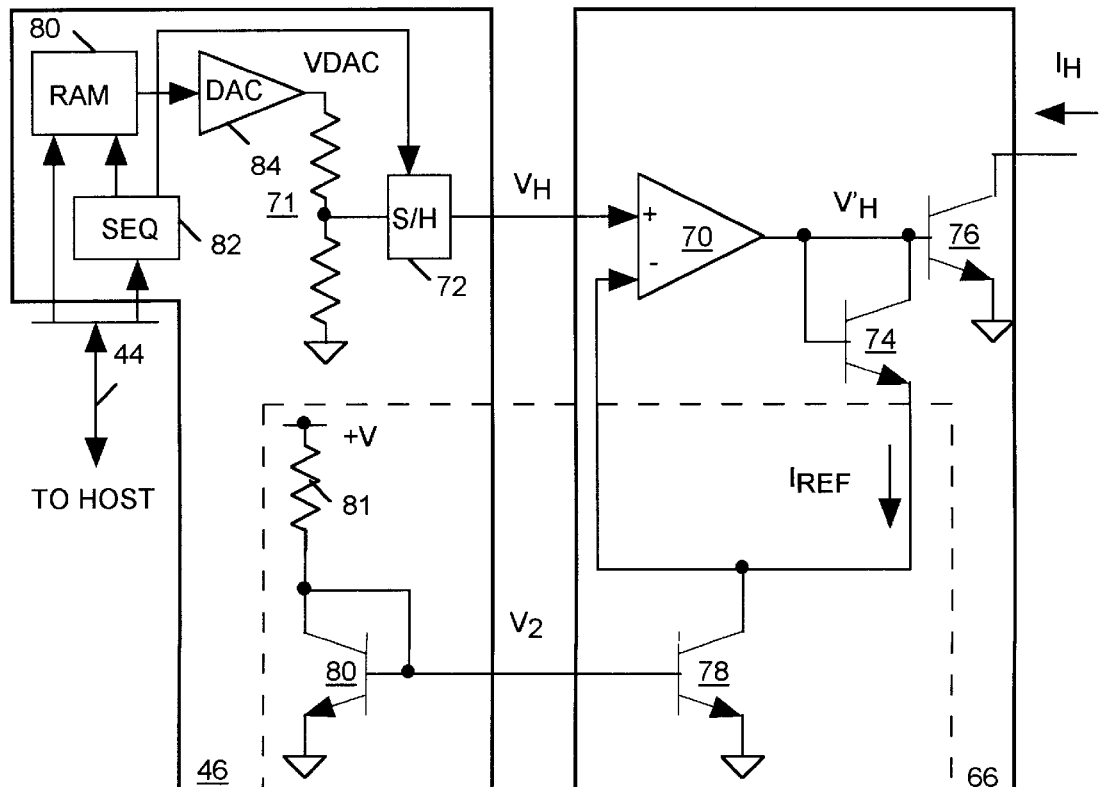
FIG. 6 is a block and schematic diagram illustrating a current source of FIG. 5 and a portion of the reference voltage source of FIG. 3 in more detail.

FIG. 6 illustrates variable current source 66 and a portion of the reference source 46 of FIG. 3 in more detailed block and schematic diagram form. Reference source 46 includes a random access memory (RAM) 80 for receiving and storing data from host computer 42 of FIG. 3 via computer bus 44 before the test. The data stored at each address of RAM 80 indicates the magnitude of a separate one of the VREF reference voltage supplied to the pin electronics circuit. After loading the data into RAM 80 the host computer signals a sequencer 82 to begin sequentially addressing RAM 80 causing it to sequentially read out its stored data values to a digital-to-analog converter (DAC) 84 which converts each data value to a corresponding analog voltage VDAC. Thus the VDAC signal takes on a succession of voltage levels, each level controlled by a separate data value stored in RAM 80.

The VDAC signal is applied through a voltage divider 71 to a sample and hold circuit 72. Sequencer 82 enables the sample and hold circuit 72 during the time the VDAC signal level is controlled by a data value in RAM 80 that is intended to define reference voltage $V_H$. Thereafter, during the test, sample and hold circuit 72 provides the $V_H$ reference input signal to current source 66. Although not shown in FIG. 6, the output of divider 71 is also supplied to other sample and hold circuits within reference source 46. These other sample and hold circuits, also controlled by sequencer 82, provide $V_H$ or $V_L$ reference voltages to current sources within load circuits of other pin electronics circuits. Additional sample and hold circuits (not shown) within source 46 also sample the VDAC signal to provide other pin electronics reference voltages. Thus all of the various reference voltages needed for the pin electronics circuits 40 of FIG. 3 are obtained by sampling or dividing and sampling the output voltage VDAC of a single DAC 84 produced in response to a data sequence the host computer stores in RAM 80.

As described above, when the data for controlling the $V_H$ input to variable current source 66 is read out of RAM 80, the resulting VDAC output of DAC 84 is divided by voltage divider 71, stored in sample and hold circuit 72 and thereafter supplied to current source 66 during the test. Current source 66 includes an operational amplifier 70 receiving the $V_H$ input from sample and hold circuit 72 and supplying an output voltage $V'_H$ to the base and collector of a transistor 74 and to the base of a transistor 76. The emitter of transistor 74 is fed back to an inverting input of operational amplifier 70. A transistor 78 within current source 66 and a resistor 81 and transistor 80 within reference source 46 form a current mirror 79, with resistor 81 linking the bases of transistors 78 and 80 and the collector of transistor 80 to a voltage source +V, the emitters of transistors 78 and 80 grounded, and the collector of transistor 78 connected to the emitter of transistor 78. Resistor 81 is sized so that transistor 78 draws a constant 100 microamp reference current $I_{REF}$ from the emitter of transistor 74. Though not shown in FIG. 6, the $V_2$ control voltage input to the base of transistor 78 is supplied as a reference voltage input to similar current sources within all pin electronics circuits.

The transconductance of bipolar transistor 76 obeys the well-known relationship $$Ic = Is \times e^{\frac{Vbe}{Vo}} \quad [1]$$

where Ic is the transistor collector current, where Is is the base-emitter junction saturation current, Vbe is the transistor base-emitter voltage and Vo is a constant, typically about 26 mV at room temperature. For transistor 76, the collector current Ic is $I_H$, the base emitter saturation current Is is $I_{REF}$ and Vbe/Vo is $kV_{DAC}$ where k is a constant having units volt$^{-1}$. The value of k is a function of the ratio of voltage divider 71. Substituting these relations into equation [1] we have for transistor 76

$$I_H = I_{REF} \times e^{kV_H} \quad [2]$$

If we adjust the resistor values within voltage divider 71 so that k=ln$_{10}$e (volt$^{-1}$), then from equation [2] we have the following non-linear, exponential relationship between $I_H$ and VDAC $$I_H = I_{REF} \times 10^{VDAC} \quad [3]$$

From equation [3] we see that a one volt change in VDAC provides a factor of 10 change in the output $I_H$ of current source 66. Thus given a reference current $I_{REF}$ of 100 micro amps and a VDAC range of −3 volts to +3 volts, the current source 66 output current $I_H$ will have a six decade range from 0.1 microamp to 100 milliamps, a range covering all commonly specified IC load currents.

Variable current source 64 of FIG. 5 is analogous to current source 66 of FIG. 6 but is implemented using PNP transistors instead of NPN transistors in order to supply a positive output current instead of a negative output current. Thus current source 64 has the exponential transfer function $-I_L = I_{REF} \times 10^{VDAC}$. By employing variable current sources 64 and 66 having non-linear, exponential transfer functions relating input voltage (VDAC) to output current ($I_H$ or $I_L$), load circuit 54 of FIG. 5 provide a wide dynamic output current range (−100 milliamps to +100 milliamps). Moreover, the load current can be accurately adjusted any level within that range without requiring switched range resistors. With an exponential transfer function, the resolution with which the output current can be adjusted is a substantially fixed percentage of the target output current rather than a fixed percentage of its maximum output current. Thus the resolution with which output current can be adjusted remains appropriate to the desired output current level throughout its full range.

Since load circuit 54 of FIG. 5 does not employ current sources requiring switched range resistors, the load circuit can be implemented completely in integrated circuit form. The load circuit is thus compact, inexpensive, and accurate and has relatively low power dissipation.

While the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. A load circuit for an integrated circuit tester for providing an adjustable load at a terminal of an integrated circuit device under test (DUT) when the DUT is generating an output signal at the terminal, the load circuit comprising:

a first current source having as output a positive current of magnitude that is a first, substantially non-linear function of an input first reference voltage, a second current source having as output a negative current of magnitude that is a second, substantially non-linear function of an input second reference voltage, and means for conveying said positive current between the first current source output and said DUT terminal when the DUT output signal is below an input threshold voltage and for otherwise conveying said negative current between the second current source output and said DUT output terminal when the DUT output signal is above said threshold voltage.

2. The load circuit in accordance with claim 1 wherein said the magnitude of said positive current is an exponential function of said input first reference voltage and wherein the magnitude of said negative current is an exponential function of said second reference voltage.

3. The load circuit in accordance with claim 1 wherein the magnitude of said negative current is proportional to a number significantly larger than 1 raised to a power proportional to the second reference voltage.

4. The load circuit in accordance with claim 3 wherein said number is substantially equal to 10.

5. The load circuit in accordance with claim 1 wherein said second current source comprises:

a first transistor having a base, an emitter and a collector;

a second transistor having a base an emitter and a collector;

an operational amplifier for amplifying a difference between said second reference voltage and a voltage appearing at the emitter of said first transistor to supply a control voltage in common to the bases of said first and second transistors and to the collector of said first transistor, and means for drawing a constant current from the emitter of said first transistor such that said second transistor produces said negative current at its collector.

6. The load circuit in accordance with claim 5 wherein said means for drawing a constant current comprises a current mirror.

7. An integrated circuit tester for testing an integrated circuit device under test DUT producing a DUT output single at a terminal thereof, the integrated circuit tester comprising:

means for sampling the DUT output signal at the DUT terminal; and a load circuit for providing an adjustable load at said DUT terminal, the load circuit comprising:

a fist current source having as output a positive current of magnitude that is a first, substantially non-linear function of an input first reference voltage, a second current source having as output a negative current of magnitude that is a second substantially non-linear function of an input second reference voltage, and means for conveying said positive current between the first current source output and said DUT terminal when a voltage of the DUT output signal is below an input threshold voltage and for conveying said negative current between the second current source output and said DUT output terminal when the voltage of the DUT output signal is above said threshold voltage.

8. The integrated circuit tester in accordance with claim 7 wherein said the magnitude of said positive current is a substantially non-linear exponential function of said input first reference voltage and wherein the magnitude of said negative current is a substantially non-linear exponential function of said second reference voltage.

9. The load circuit in accordance with claim 7 wherein the magnitude of said negative current is proportional to a number larger than 1 raised to a power proportional to the second reference voltage.

10. The load circuit in accordance with claim 9 wherein said number is substantially equal to 10.

11. The integrated circuit tester in accordance with claim 7 wherein said second current source comprises:

a first transistor having a base, an emitter and a collector;

a second transistor having a base an emitter and a collector;

an operational amplifier for amplifying a difference between said second reference voltage and a voltage appearing at the emitter of said first transistor to supply a control voltage in common to the bases of said first and second transistors and to the collector of said first transistor, and means for drawing a constant current from the emitter of said first transistor such that said second transistor produces said negative current at its collector.

12. The integrated circuit tester in accordance with claim 11 wherein said means for drawing a constant current comprises a current mirror.

13. An apparatus for producing an output current having a magnitude that is controlled by input data, the apparatus comprising:

digital-to-analog converter (DAC) for receiving said input data and producing an output voltage of magnitude controlled by said input data;

means for receiving and voltage dividing the DAC output voltage to produce a reference voltage, a first transistor having a base, an emitter and a collector and producing a feedback voltage at its emitter;

a second transistor having a base an emitter and a collector;

an operational amplifier for amplifying a difference between said reference voltage and said feedback voltage to supply a control voltage in common to the bases of said first and second transistors and to the collector of said first transistor, and means for drawing a constant reference current from the emitter of said first transistor such that said second transistor produces said output current in its collector.

14. The apparatus in accordance with claim 13 wherein a relation of reference voltage to DAC output voltage is such that the magnitude of said output current is proportional to a product of said reference current and a substantially non-linear, exponential function of the DAC output voltage.

15. The apparatus in accordance with claim 14 wherein the magnitude of said output current is proportional to a product of said reference current and a value substantially equal to 10 raised to a number proportional to the DAC output voltage.

16. A variable current source for producing an output current having a magnitude that is a non-linear function of an input voltage, the variable current source comprising:

a first transistor having a base, an emitter and a collector;

a second transistor having a base an emitter and a collector;

a voltage divider for receiving and dividing said input voltage to produce a reference voltage;

an operational amplifier for amplifying a difference between said reference voltage and a feedback voltage appearing at the emitter of said first transistor to supply a control voltage in common to the bases of said first and second transistors and to the collector of said first transistor, and means for drawing a constant reference current from the emitter of said first transistor such that said second transistor produces said output current in its collector, wherein the voltage divider has a divider ratio adjusted such that a magnitude of said output current is proportional to said reference current by a constant of proportionality that is a substantially non-linear, exponential function of said input voltage.

* * * * *